United States Patent [19]

Mayes

[11] Patent Number: 5,180,930
[45] Date of Patent: Jan. 19, 1993

[54] METHOD AND APPARATUS FOR REDUCING THE EFFECTS OF FEEDBACK SWITCH CHARGE INJECTION INTO A PLURALITY OF SERIALLY CONNECTED SAMPLE DATA COMPARATORS

[75] Inventor: Michael K. Mayes, Sunnyvale, Calif.

[73] Assignee: National Semiconductor Corp., Santa Clara, Calif.

[21] Appl. No.: 703,030

[22] Filed: May 17, 1991

[51] Int. Cl.$^5$ .................. H03K 17/16; H03K 5/24; G11C 27/02

[52] U.S. Cl. .................. 307/353; 307/355; 307/491; 307/494; 307/572

[58] Field of Search .............. 307/355, 362, 353, 491, 307/494, 572

[56] References Cited

U.S. PATENT DOCUMENTS

| | | | |
|---|---|---|---|
| 4,028,558 | 6/1977 | Heller et al. | 307/355 |
| 4,075,509 | 2/1978 | Redfern | 307/355 |
| 4,523,107 | 6/1985 | Peterson | 307/362 |
| 4,899,068 | 2/1990 | Klose et al. | 307/355 |

Primary Examiner—John Zazworsky
Attorney, Agent, or Firm—Townsend and Townsend

[57] ABSTRACT

In a sample and hold circuit comprising a plurality of serially connected comparators wherein each comparator has a feedback switch coupled between an input terminal and an output terminal of the comparator, and wherein data is held on high impedance capacitive nodes, when the series of feedback switches turn off, a capacitor is coupled across a current switching transistor which has a control terminal coupled for receiving a feedback switch control signal. When the feedback switch control signal undergoes a transition, the capacitor causes a voltage to ramp up or down. A current limiting transistor having a control terminal coupled for receiving a delay control signal is coupled in series with the current switching transistor for controlling the rate of current flow through the current switching transistor in accordance with the magnitude of the delay control signal. The voltage at the capacitor is coupled to a compare circuit having an output signal which changes state when the voltage at the capacitor passes a threshold value. This output signal functions as a delayed switching signal for delaying the turnoff of subsequent feedback switches in the series.

34 Claims, 5 Drawing Sheets

METHOD AND APPARATUS FOR REDUCING THE EFFECTS OF FEEDBACK SWITCH CHARGE INJECTION INTO A PLURALITY OF SERIALLY CONNECTED SAMPLE DATA COMPARATORS

BACKGROUND OF THE INVENTION

Figure 1:
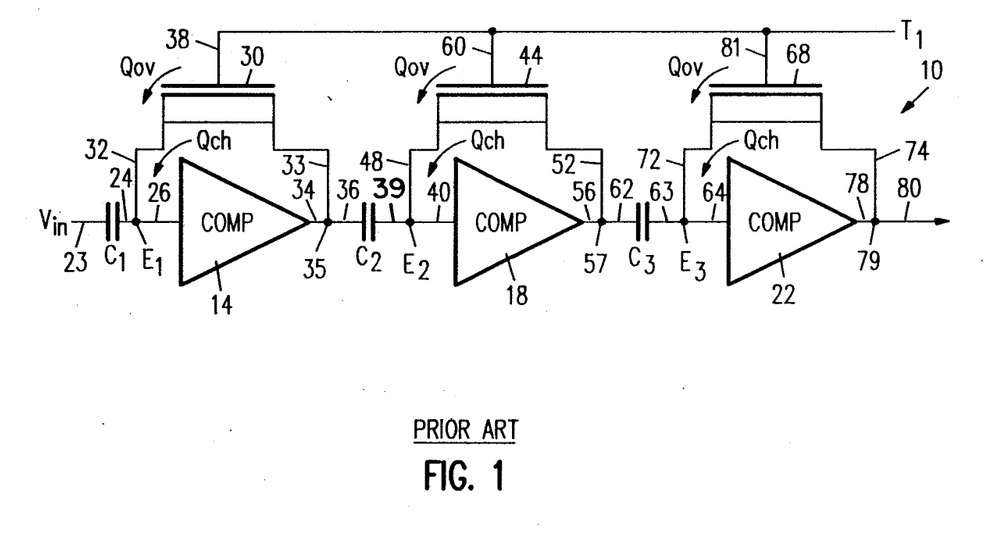
FIG. 1 is a schematic diagram showing a known sample and hold circuit comprising three serially connected comparators.

In sample and hold circuits which employ sample data comparators, analog voltages are sampled and held on high impedance capacitive nodes using MOS switches. Since the gain of a single comparator is finite, many of these types of circuits use a plurality of serially connected comparators to increase the overall gain. FIG. 1 is a schematic drawing of such a sample and hold circuit 10 comprising three comparators 14, 18, and 22. An input voltage $V_{IN}$ to be sampled is provided to one terminal 23 of a capacitor C1. The other terminal 24 of capacitor C1 is coupled to a node E1 between an input terminal 26 of comparator 14 and a first terminal 32 of a feedback switch 30. The other input terminal of comparator 14 (not shown) is coupled to a reference potential. An output terminal 34 of comparator 14 is connected to a node 35 between a terminal 36 of a capacitor C2 and a second terminal 33 of feedback switch 30. Switch 30 also includes a control terminal 38 which receives a feedback switch control signal T1 for selectively allowing current to flow between first terminal 32 and second terminal 33.

The other terminal 39 of capacitor C2 is coupled to a node E2 between an input terminal 40 of comparator 18 and a first terminal 48 of a feedback switch 44. An output terminal 56 of comparator 18 is coupled to a node 57 between a terminal 62 of a capacitor C3 and a second terminal 52 of feedback switch 44. Feedback switch 44 also has a control terminal 60 which receives signal T1 for selectively allowing current to flow between first terminal 48 and second terminal 52 in the same manner as feedback switch 30. Output terminal 56 of comparator 18 is coupled to a terminal 62 of a capacitor C3. The other terminal 63 of capacitor C3 is coupled to a node E3 between an input terminal 64 of comparator 22 and a first terminal 72 of a feedback switch 68. An output terminal 78 of comparator 22 is coupled to a node 79 between a voltage output line 80 and a second terminal 74 of feedback switch 68. Feedback switch 68 also includes a control terminal 81 which receives signal T1 for selectively allowing current to flow between first terminal 72 and second terminal 74 in the same manner as feedback switches 30 and 44.

In this embodiment, current is allowed to flow through feedback switches 30, 44 and 68 for biasing comparators 14, 18 and 22 to their trip points when T1 is high. After $V_{IN}$ has been sampled, T1 goes low, feedback switches 30, 44 and 68 turn off, and comparators 14, 18 and 22 enter their high gain region of operation. At that time comparator 14 is capacitively coupled with C1 in order to independently store the DC bias point of comparator 14 while passing any AC signals. The same is true with comparator 18/capacitor C2 and comparator 22/capacitor C3. When feedback switches 30, 44 and 68 turn off, they inject charge into their corresponding high impedance storage nodes (i.e., nodes E1, E2 and E3, respectively), and this alters the sampled voltage.

The altered voltage at node E1 contributes directly to the total offset error voltage for the circuit. For this circuit, the overall gain is the product of the gain of comparator 14, 18 and 22. Since the voltage at node E2 is isolated from the input by comparator 14, its contribution to the total offset error voltage is reduced by a factor equal to the gain of comparator 14. Similarly, the offset error voltage generated by switch 68 and appearing at node E3 is reduced by the product of the gain of comparators 14 and 18. Thus, the total offset error voltage $V_{OEIN}$ as sensed by the input to the series of comparators is $$V_{OEIN} = V_{OE1} + V_{OE2}/A1 + V_{OE3}/(A1 \times A2).$$

Where $V_{OE1}$, $V_{OE2}$ and $V_{OE3}$ are the offset error voltages at nodes E1, E2 and E3, respectively, and where A1, A2 and A3 are the gains for comparators 14, 18 and 22, respectively.

It should be apparent that, for single comparator gains greater than 1, the dominant contributor to $V_{OEIN}$ is $V_{OE1}$. Thus, the effects of charge injection by feedback switch 30 should be minimized or eliminated wherever possible.

One known way to cancel the effect of the first stage error, $V_{OE1}$, is to delay turning off feedback switch 44 until comparator 14 has settled to its charge-injection altered trip point. If feedback switch 44 is on while comparator 14 is settling, then the error generated by the first stage charge injection ($V_{OE1}$) does not affect the output of the overall circuit. One technique for delaying or staggering the turnoff times of the individual feedback switches is to add several inverter delays between the control terminals of the feedback switches. Unfortunately, the amount of the delays is limited by the delay value of each inverter and the preset number of inverters that are built into the circuit. This makes it difficult if not impossible to compensate for charge injection if the operating environment of the circuit deviates from the assumptions made during the initial stages of the circuit design.

SUMMARY OF THE INVENTION

The present invention is directed to a method and apparatus for reducing the effects of feedback switch charge injection into a plurality of serially connected sample data comparators wherein a current-programmable delay circuit is used to externally control the amount of delay between turn off of individual feedback switches connected between the input and output terminals of the comparators. The delay thus may be optimized to account for different operating parameters such as power supply rejection ratio, switching signal voltage, temperature sensitivity, the particular circuit configuration, and other factors.

In one embodiment of a current-programmable delay circuit according to the present invention, a capacitor is coupled across a current switching transistor which has a control terminal coupled for receiving a feedback switch control signal. When the feedback switch control signal undergoes a transition, the capacitor causes a voltage to ramp up or down. A current limiting transistor having a control terminal coupled for receiving a delay control signal is coupled in series with the current switching transistor for controlling the rate of current flow through the current switching transistor in accordance with the magnitude of the delay control signal. The voltage at the capacitor is coupled to a compare circuit having an output signal which changes state when the voltage at the capacitor passes a threshold value. This output signal functions as a delayed switching signal which may be used to turn off a succeeding feedback switch in the series.

DETAILED DESCRIPTION OF THE PREFERRED EMBODIMENTS

Figure 2:
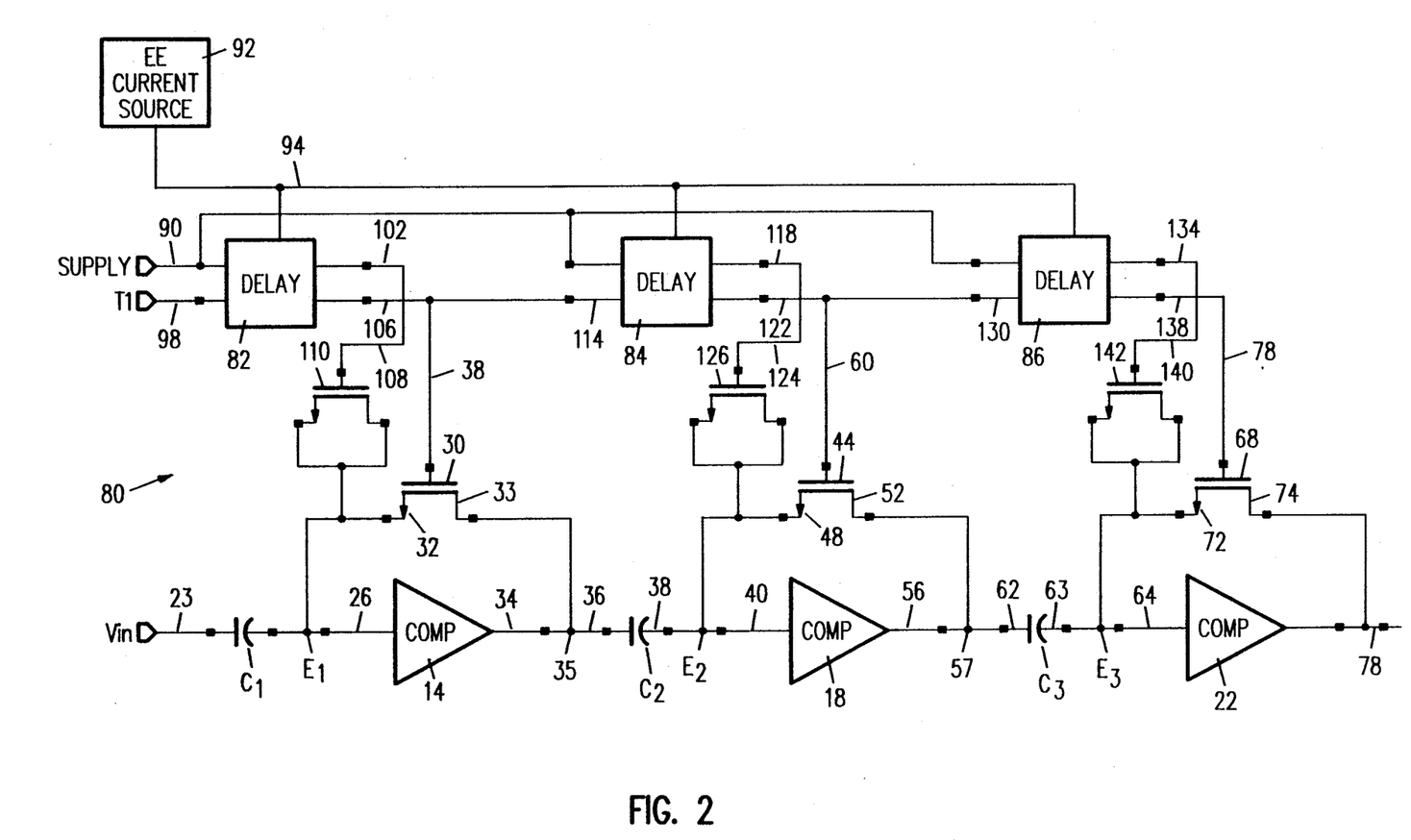
FIG. 2 is a schematic diagram of a particular embodiment of an apparatus according to the present invention for reducing the effects of feedback switch charge injection into the circuit shown in FIG. 1.

FIG. 2 is a schematic diagram of a circuit 80 which incorporates current-programmable delay elements 82, 84 and 86 according to the present invention for reducing the effects of feedback switch charge injection into the circuit. The elements of circuit 80 which remain the same from FIG. 1 are numbered the same. Each delay element 82, 84 and 86 receives a supply voltage on a supply line 90 and a delay select signal, e.g., from an electrically erasable EE programmable current source 92, on a delay select line 94. The magnitude of the delay select signal determines the amount of delay produced by each delay circuit. Delay element 82 also receives a feedback switch control signal T1 over a feedback switch control line 98. Delay element 82 produces a first delayed feedback switch control signal on a line 102 and a second delayed feedback switch control signal on a line 106. Line 102 is coupled to the gate terminal 108 of an NMOS transistor 110 whose source and drain terminals are coupled together and to terminal 32 of transistor 30. In this embodiment, transistor 30 is an NMOS transistor, and terminal 32 is the source terminal of the transistor. Transistor 110 functions as a dummy device which further reduces charge injection into node E1. Line 106 is coupled to the gate terminal of transistor 30 and to a feedback switch control line 114 of delay element 84.

Delay element 84 produces a first delayed feedback switch control signal on a line 118 and a second delayed feedback switch control signal on a line 122 in response to the signal received on feedback switch control line 114 in a manner similar to delay element 82. Line 118 is coupled to the gate terminal 124 of an NMOS dummy device transistor 126 whose source and drain terminals are coupled together and to the source terminal 48 of NMOS feedback transistor 44. Line 122 is coupled to the gate terminal 60 of transistor 44 and to a feedback switch control line 130 of delay element 86.

Delay element 86 produces a first delayed feedback switch control signal on a line 134 and a second delayed feedback switch control signal on a line 138 in response to the signal received on feedback switch control line 130 in a manner similar to delay elements 82 and 84. Line 134 is coupled to the gate terminal 140 of an NMOS dummy device transistor 142 whose source and drain terminals are coupled together and to the source terminal 72 of NMOS feedback transistor 68. Line 138 is coupled to the gate terminal 78 of transistor 68.

In operation, the feedback switch control signal T1 on feedback switch control line 98 is delayed by delay circuit 82 in an amount determined by the magnitude of the delay select signal on delay select line 94, and the delayed feedback switch control signal appears on line 106. The signal on line 102 is an inverted copy of the signal appearing on line 106. Thus, when the signal on line 106 turns transistor 30 off, the signal on line 102 turns transistor 110 on in order to absorb some of the charge injected into node E1 by transistor 30. The delayed feedback switch control signal on line 106 is also used to trigger the operation of delay circuit 84.

Delay circuit 84 further delays the delayed feedback switch control signal received on line 114 by an amount determined by the magnitude of the delay select signal received on delay select line 94, and it also produces delayed complementary feedback switch control signals on lines 118 and 122. As with the previous comparator stage, the signal on line 118 turns transistor 126 on as the signal on line 122 turns transistor 44 off. The delayed feedback switch control signal on line 122 is then used to trigger the operation of delay circuit 86.

Delay circuit 86 further delays the delayed feedback switch control signal received on line 130 by an amount determined by the magnitude of the delay select signal on delay select line 94 and produces complementary feedback switch control signals on lines 134 and 138. Once again, the signal on line 134 turns transistor 142 on as the signal on line 138 turns transistor 68 off.

Figure 3:
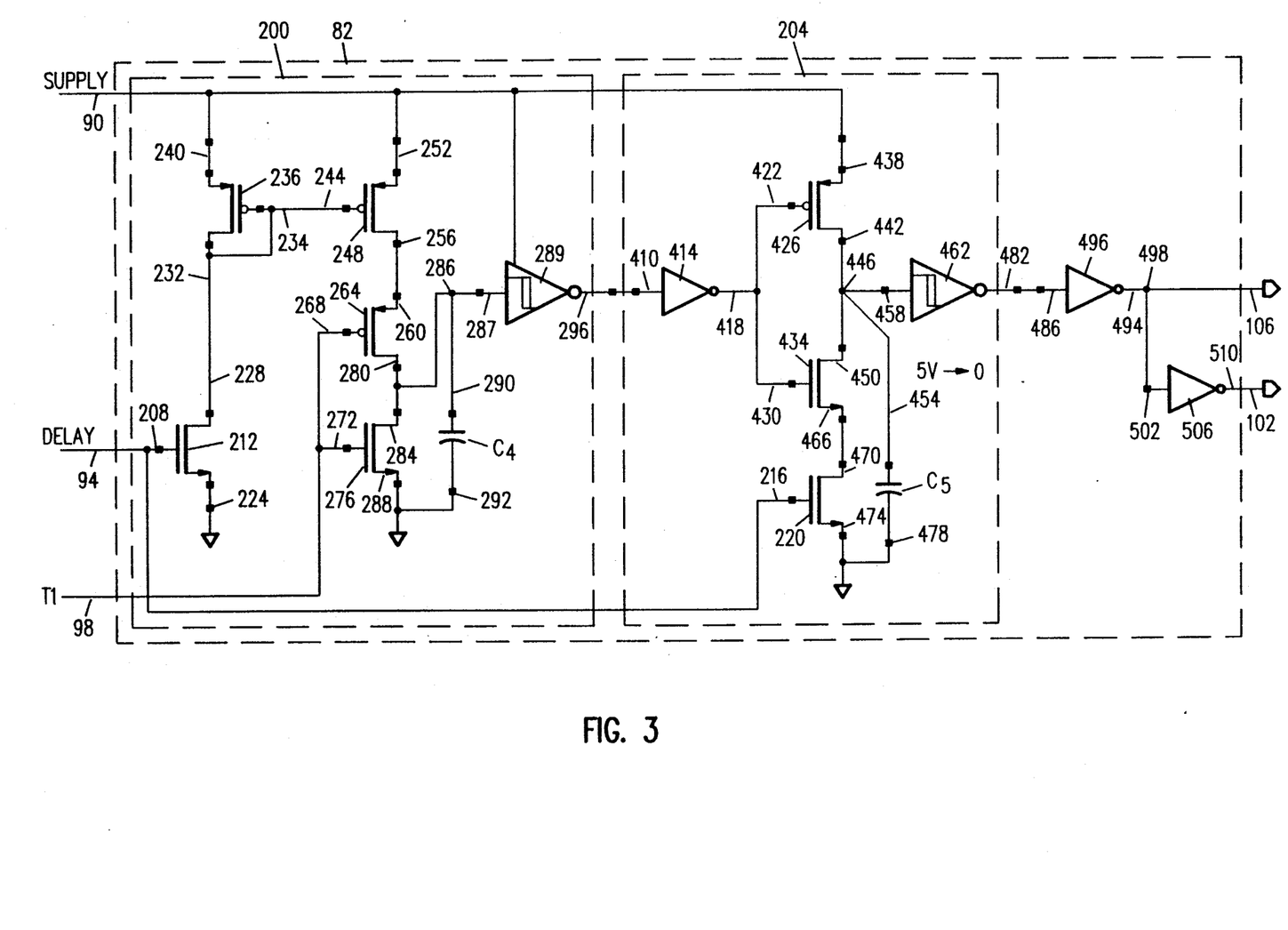
FIG. 3 is a schematic diagram of a particular embodiment according to the present invention of a delay circuit shown in FIG. 2.

FIG. 3 is a schematic diagram of a particular embodiment of delay circuit 82 shown in FIG. 2. Delay circuits 84 and 86 are constructed the same way. In this embodiment, delay circuit 82 includes a first delay section 200 and a second delay section 204. Delay control line 94 is coupled to a gate terminal 208 of an NMOS transistor 212 in first delay section 200 and to a gate terminal 216 of an NMOS transistor 220 in second delay section 204. Transistors 212 and 220 function as current limiting transistors for reasons described below. A source terminal 224 of transistor 212 is coupled to a ground potential. A drain terminal 228 of transistor 212 is coupled to a drain terminal 232 and to a gate terminal 234 of a PMOS transistor 236. A source terminal 240 of transistor 236 is coupled to supply line 90. Gate terminal 234 of transistor 236 is coupled to a gate terminal 244 of a PMOS transistor 248. A source terminal 252 of transistor 248 is coupled to supply line 90, and a drain terminal 256 of transistor 248 is coupled to a drain terminal 260 of a PMOS transistor 264.

The feedback switch control signal T1 on line 98 is coupled to a gate terminal 268 of transistor 264 and to a gate terminal 272 of a NMOS transistor 276. A drain terminal 280 of transistor 264 is coupled to a drain terminal 284 of transistor 276 as well as to a node 286 between an input terminal 287 of a Schmidt circuit 289 and a terminal 290 of a capacitor C4. A source terminal 288 of transistor 276 is coupled to a ground potential and to a terminal 292 of capacitor C4. As mentioned previously, transistor 212 functions as a current limiting transistor. The amount of current flowing through transistor 212, and hence transistor 236, is determined by the magnitude of the delay select signal appearing on delay select line 94. The current flowing through transistors 212 and 236 is mirrored by transistor 248, so the amount of current allowed to flow through transistor 248 is also determined by the magnitude of the signal on delay line 94. When T1 changes from high to low, capacitor C4 charges at a rate determined by the amount of current flowing through transistors 248, 264 and 276. Thus, capacitor C4 charges at a rate determined by the magnitude of the delay select signal on delay select line 94. When the upwardly ramping voltage on capacitor C4 passes a threshold value determined by Schmidt circuit 289, a low signal appears on an output terminal 296 of Schmidt circuit 289.

Figure 4:
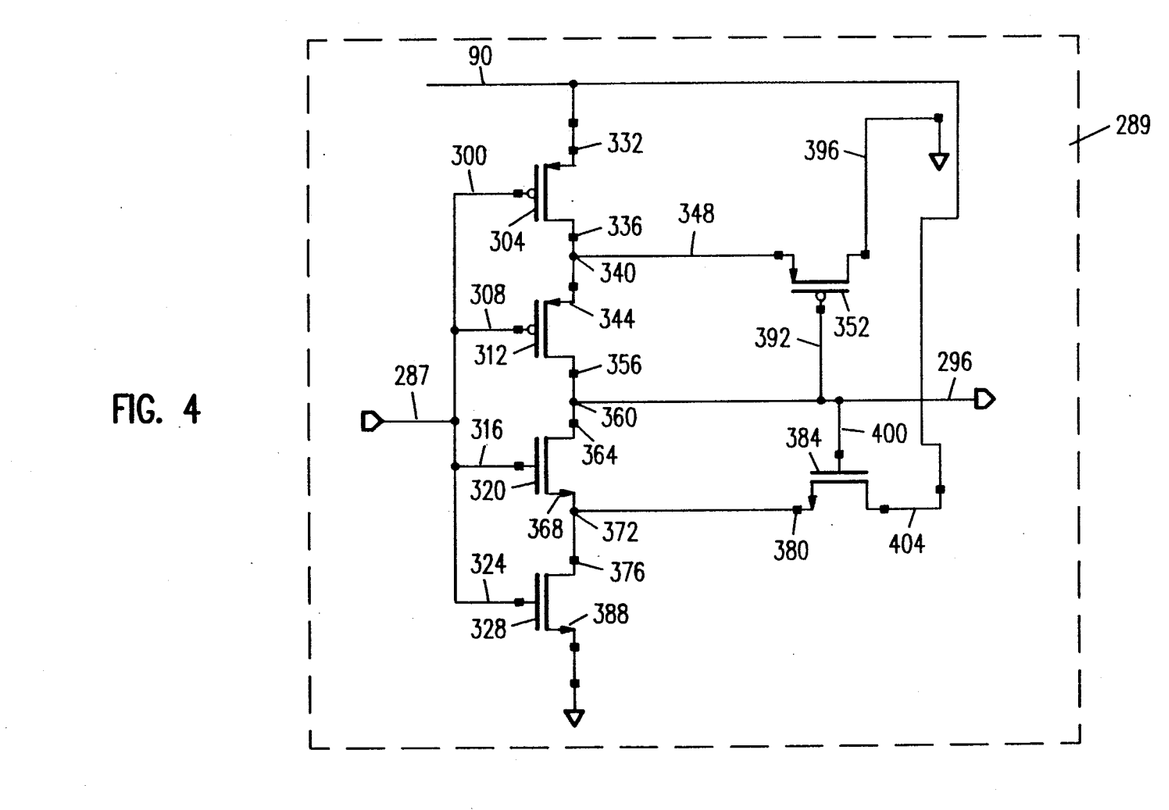
FIG. 4 is a schematic diagram of a particular embodiment according to the present invention of a Schmidt circuit shown in FIG. 3.

FIG. 4 is a schematic diagram of a particular embodiment of Schmidt circuit 289. As shown in FIG. 4, input terminal 287 is coupled to a gate terminal 300 of a PMOS transistor 304, to a gate terminal 308 of a PMOS transistor 312, to a gate terminal 316 of a NMOS transistor 320, and to a gate terminal 324 of an NMOS transistor 328. PMOS transistor 304 has a source terminal 332 coupled to supply line 90 and a drain terminal 338 coupled to a node 340 between a source terminal 344 of transistor 312 and a source terminal 348 of a PMOS transistor 352. PMOS transistor 312 has a drain terminal 356 coupled to a node 360 between output terminal 296 and a drain terminal 364 of transistor 320. Transistor 320 has a source terminal 368 coupled to a node 372 between a drain terminal 376 of transistor 328 and a source terminal 380 of an NMOS transistor 384. A source terminal 388 of transistor 328 is coupled to a ground potential. Transistor 352 has a gate terminal 392 coupled to output terminal 296 and drain terminal 396 coupled to a ground potential. Transistor 384 has a gate terminal 400 coupled to output terminal 296 and a drain terminal 404 coupled to supply line 90.

In operation, only one pair of transistors 304 and 312 or 320 and 328 conduct at any given moment. The signal on line 296 is high when transistors 304 and 312 are conducting, whereas the signal on line 296 is low when transistors 320 and 328 are conducting.

Output terminal 296 of Schmidt circuit 289 is coupled to an input terminal 410 of an inverter 414. An output terminal 418 of inverter 414 is coupled to a gate terminal 422 of a PMOS transistor 426 and to a gate terminal 430 of an NMOS transistor 434. Transistor 426 has a source terminal 438 coupled to supply line 90 and a drain terminal 442 coupled to a node 446 between a drain terminal 450 of transistor 434, a terminal 454 of a capacitor C5, and an input terminal 458 of a Schmidt circuit 462. Transistor 434 has a source terminal 466 coupled to a drain terminal 470 of transistor 220. Transistor 220 has a source terminal 474 coupled to a ground potential and to another terminal 478 of capacitor C5.

Before a low signal appears on output terminal 296 of Schmidt circuit 289, transistor 426 is conducting and capacitor C5 is charged to its maximum voltage. When the signal on output terminal 296 makes a transition to a low state, then transistor 426 stops conducting and transistor 434 begins conducting for discharging capacitor C5. As noted previously, transistor 220 is a current limiting transistor wherein the amount of current flowing through transistor 220 is determined by the magnitude of the delay select signal on delay select line 94. Consequently, the rate of current flow through transistor 434 is also dependent upon the magnitude of the delay select signal on delay select line 94, and capacitor C5 discharges accordingly. When the downwardly voltage on capacitor C5 falls below the threshold level of Schmidt circuit 462, then a high signal appears on an output terminal 482 of Schmidt circuit 462. This signal is communicated to an input terminal 486 of an inverter 490 for producing a low signal on an output terminal 494 of inverter 490. Output terminal 494 is coupled to a node 498 between line 106 and an input terminal 502 of an inverter 506. An output terminal 510 of inverter 506 is coupled to line 102. The signals on lines 102 and 106 are then used to switch transistors 110 and 30, respectively.

Figure 5:
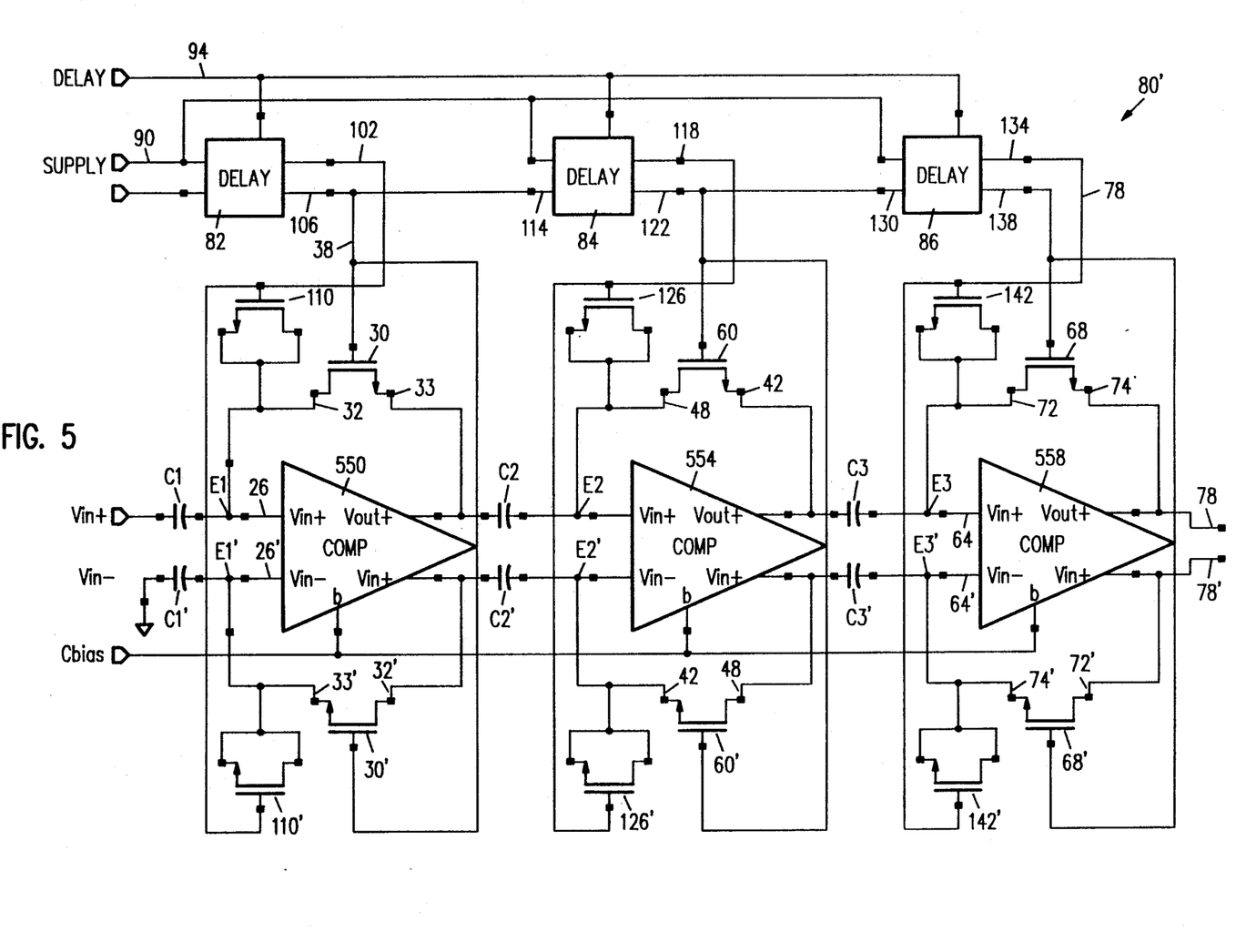
FIG. 5 is a schematic diagram showing an alternative embodiment of an apparatus for reducing the effects of feedback switch charge injection wherein the sample and hold circuit is formed of a plurality of serially connected differential comparators.

While the above is a complete description of a preferred embodiment of the present invention, various modifications may be employed. For example, although the two delay sections 200 and 204 in delay element 82 make delay independent of the supply voltage, delay element 82 may be constructed with only one delay section, and the teachings of the present invention may be applied to other types of sample and hold circuits. FIG. 5 is a schematic of such a circuit 80' wherein the same components bear the same references numbers as circuit 80 in FIG. 2. Circuit 80' includes three serially connected differential comparators 550, 554, and 558. In addition to the regular voltage input ($V_{IN+}$) to capacitor C1, circuit 80' includes a complementary voltage input ($V_{IN-}$) which is processed by capacitances C1', C2' and C3' in response to feedback transistors 30', 60' and 68' and dummy devices 110', 126' and 142' which are coupled to nodes E1', E2' and E3'.

Consequently, the scope of the invention should not be limited except as described in the claims.

What is claimed is:

1. In an apparatus having first and second serially coupled sample data comparators, the first sample data comparator including a first feedback switch coupled thereto that is activated by a switching signal, and the second sample data comparator including a second feedback switch coupled thereto that is activated by the switching signal, an apparatus for reducing effects of charge injection from the first and second feedback switches comprising:

delay selection means for selecting an amount of signal delay;
   delay means, coupled to the delay selection means and to the second feedback switch, for delaying the receipt of the switching signal by the second feedback switch from the receipt of the switching signal by the first feedback switch by the selected amount of signal delay, the delay means comprising:
   voltage ramp means for ramping a voltage in response to the switching signal;
   comparing means, coupled to the voltage ramp means, for comparing the ramped voltage to a threshold value; and
   delayed signal generating means, coupled to the comparing means, for communicating the switching signal to the second feed back switch when the ramped voltage passes the threshold value.

2. The apparatus according to claim 1 wherein the delay selection means comprises ramp rate adjusting means, coupled to the voltage ramp means, for adjusting the rate of ramping of the voltage.

3. The apparatus according to claim 2 wherein the voltage ramp means comprises a capacitance.

4. The apparatus according to claim 3 wherein the voltage ramp means further comprises a current switch, coupled to the capacitance, for selectively allowing the communication of current with the capacitance in response to the switching signal.

5. The apparatus according to claim 4 wherein the ramp rate adjusting means comprises current limiting means, coupled to the current switch, for adjusting the rate of current flowing through the current switch.

6. The apparatus according to claim 5 wherein the current switch comprises a first transistor which flows current in response to the switching signal.

7. The apparatus according to claim 6 wherein the current limiting means comprises a second transistor coupled to the first transistor, the second transistor having a control terminal coupled for receiving a delay signal, the second transistor allowing an amount of current to flow through the first transistor corresponding to the magnitude of the delay signal.

8. The apparatus according to claim 7 further comprising an EE programmable current source coupled to the second transistor for providing the delay signal to the second transistor.

9. In an apparatus having first and second serially coupled sample data comparators, the first sample data comparator including a first feedback switch coupled thereto that is activated by a switching signal, and the second sample data comparator including a second feedback switch coupled thereto that is activated by the switching signal, an apparatus for reducing effects of charge injection from the first and second feedback switches comprising:
delay selection means for selecting an amount of signal delay;
delay means, coupled to the delay selection means and to the second feedback switch, for delaying the receipt of the switching signal by the second feedback switch from the receipt of the switching signal by the first feedback switch by the selected amount of signal delay, the delay means comprising:
first voltage ramp means for ramping a first voltage in a first direction in response to the switching signal;
first comparing means, coupled to the first voltage ramp means, for comparing the ramped first voltage to a first threshold value; .
first delayed signal generating means, coupled to the first comparing means, for providing a first delayed switching signal when the ramped first voltage passes the first threshold value;
second voltage ramp means for ramping a second voltage in a second direction opposite the first direction in response to the first delayed switching signal;
second comparing means, coupled to the second voltage ramp means, for comparing the ramped second voltage to a second threshold value; and
second delayed signal generating means, coupled to the second comparing means, for communicating the switching signal to the second feedback switch when the ramped second voltage passes the second threshold value.

10. The apparatus according to claim 9 wherein the delay selection means comprises ramp rate adjusting means, coupled to the first voltage ramp means, for adjusting the rate of ramping of the first voltage.

11. The apparatus according to claim 9 wherein the delay selection means comprises ramp rate adjusting means, coupled to the second voltage ramp means, for adjusting the rate of ramping of the second voltage.

12. The apparatus according to claim 9 wherein the delay selection means comprises:
first ramp rate adjusting means. coupled to the first voltage ramp means, for adjusting the rate of ramping of the first voltage; and
second ramp rate adjusting means, coupled to the second voltage ramp means, for adjusting the rate of ramping of the second voltage.

13. The apparatus according to claim 12 wherein the first voltage ramp means comprises a first capacitance, and wherein the second voltage ramp means comprises a second capacitance.

14. The apparatus according to claim 13 wherein the first voltage ramp means further comprises a first current switch, coupled to the first capacitance, for selectively allowing the communication of current with the first capacitance in response to the switching signal, and wherein the second voltage ramp means further comprises a second current switch, coupled to the second capacitance, for selectively allowing the communication of current with the second capacitance in response to the first delayed switching signal.

15. The apparatus according to claim 14 wherein the first ramp rate adjusting means comprises first current limiting means, coupled to the first current switch, for adjusting the rate of current flowing through the first current switch, and wherein the second ramp rate adjusting means comprises second current limiting means, coupled to the second current switch, for adjusting the rate of current flowing through the second current switch.

16. The apparatus according to claim 15 wherein the first current switch comprises a first transistor which flows current in response to the switching signal, and wherein the second current switch comprises a second transistor which flows current in response to the first delayed switching signal.

17. The apparatus according to claim 16 wherein the first current limiting means comprises a third transistor coupled in series with the first transistor, the third transistor having a control terminal for allowing an amount of current to flow through the first transistor corresponding to the magnitude of a first delay signal applied thereto, and wherein the second current limiting means comprises a fourth transistor coupled in series with the second transistor, the fourth transistor having a control terminal for allowing an amount of current to flow through the second transistor corresponding to the magnitude of a second delay signal applied thereto.

18. The apparatus according to claim 17 wherein the magnitude of the first delay signal is the same as the magnitude of the second delay signal.

19. The apparatus according to claim 18 further comprising an EE programmable current source, coupled to the third and fourth transistors, for providing the first and second delay signals to the third and fourth transistors.

20. In an apparatus having first and second serially coupled sample data comparators, the first sample data comparator including a first feedback switch coupled thereto that is activated by a switching signal, and the second sample data comparator including a second feedback switch coupled thereto that is activated by the switching signal, an method for reducing the effects of charge injection from the first and second feedback switches comprising the steps of:
ramping a voltage in response to the switching signal;
comparing the ramped voltage to a threshold value; and communicating the switching signal to the second feedback switch when the ramped voltage passes the threshold value.

21. The method according to claim 20 further comprising the step of adjusting the rate of ramping of the voltage.

22. The method according to claim 21 wherein the voltage ramping step comprises the step of selectively allowing the communication of current with a capacitance through a current switch in response to the switching signal.

23. The method according to claim 22 wherein the ramp rate adjusting step comprises the step of adjusting the rate of current flowing through the current switch.

24. The method according to claim 23 wherein the current rate adjusting step comprises the step of allowing an amount of current to flow through the current switch corresponding to the magnitude of a delay signal.

25. The method according to claim 24 further comprising the step of providing the delay signal with an EE programmable current source.

26. In an apparatus having first and second serially coupled sample data comparators, the first sample data comparator including a first feedback switch coupled thereto that is activated by a switching signal, and the second sample data comparator including a second feedback switch coupled thereto that is activated by the switching signal, a method for reducing the effects of charge injection from the first and second feedback switches comprising the steps of:
    ramping a first voltage in a first direction in response to the switching signal;
    comparing the ramped first voltage to a first threshold value;
    providing a first delayed switching signal when the ramped first voltage passes the first threshold value;
    ramping a second voltage in a second direction opposite the first direction in response to the first delayed switching signal;
    comparing the ramped second voltage to a second threshold value; and
    communicating the switching signal to the second feedback switch when the ramped second voltage passes the second threshold value.

27. The method according to claim 26 further comprising the step of adjusting the rate of ramping of the first voltage.

28. The method according to claim 26 further comprising the step of adjusting the rate of ramping of the second voltage.

29. The method according to claim 26 further comprising the steps of:
    adjusting the rate of ramping of the first voltage; and
    adjusting the rate of ramping of the second voltage.

30. The method according to claim 29 wherein the first voltage ramping step comprises the step of selectively allowing the communication of current with a first capacitance through a first current switch in response to the switching signal, and wherein the second voltage ramping step comprises the step of selectively allowing the communication of current with a second capacitance through a second current switch in response to the first delayed switching signal.

31. The method according to claim 30 wherein the first ramp rate adjusting step comprises the step of adjusting the rate of current flowing through the first current switch, and wherein the second ramp rate adjusting step comprises the step of adjusting the rate of current flowing through the second current switch.

32. The method according to claim 31 wherein the first current rate adjusting step comprises the step of allowing an amount of current to flow through the first current switch corresponding to the magnitude of a first delay signal, and wherein the second current rate adjusting step comprises the step of allowing an amount of current to flow through the second current switch corresponding to the magnitude of a second delay signal.

33. The method according to claim 31 further comprising the step of providing the first and second delay signals with an EE programmable current source.

34. The method according to claim 31 wherein the magnitude of the first delay signal is the same as the magnitude of the second delay signal.

* * * * *